United States Patent [19]
Weber et al.

[11] Patent Number: 5,901,064
[45] Date of Patent: * May 4, 1999

[54] SYSTEM AND METHOD FOR SCOPING GLOBAL NETS IN A HIERARCHICAL NETLIST

[75] Inventors: Larren Gene Weber, Calwell; Ronald L. Taylor, Meridian, both of Id.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/692,742

[22] Filed: Aug. 6, 1996

[51] Int. Cl.$^6$ .................................................. G06F 17/50
[52] U.S. Cl. ............................................. 364/490; 364/488
[58] Field of Search ................................... 364/488, 489, 364/490, 491

[56] References Cited

U.S. PATENT DOCUMENTS

| | | | |
|---|---|---|---|
| 4,831,543 | 5/1989 | Mastellone | 364/489 |
| 4,878,179 | 10/1989 | Larsen et al. | 364/490 |
| 5,222,030 | 6/1993 | Dangelo et al. | 364/489 |
| 5,249,133 | 9/1993 | Batra | 364/489 |
| 5,278,769 | 1/1994 | Bair et al. | 364/490 |
| 5,301,318 | 4/1994 | Mittal | 395/600 |
| 5,341,309 | 8/1994 | Kawata | 364/489 |
| 5,463,563 | 10/1995 | Bair et al. | 364/490 |
| 5,471,398 | 11/1995 | Stephens | 364/490 |
| 5,473,546 | 12/1995 | Filseth | 364/489 |
| 5,481,473 | 1/1996 | Kim et al. | 364/490 |
| 5,526,277 | 6/1996 | Dangelo et al. | 364/489 |
| 5,548,524 | 8/1996 | Hernandez et al. | 364/489 |
| 5,550,714 | 8/1996 | Nishiyama | 364/490 |
| 5,586,319 | 12/1996 | Bell | 395/701 |

OTHER PUBLICATIONS

Frezza, S.T., et al., "SPAR: A Schematic Place and Route System", *IEEE Transactions on Computer–Aided Design of Integrated Circuits and Systems*, 12, 7, 956–973, (1993).

Sekine, M., et al., "An Advanced Design System: Design Capture, Functional Test Generation, Mixed Level Simulation and Logic Synthesis (VLSI)", *IEEE Proceedings of IEEE Custom Integrated Circuits Conference*, 19.4.1–19.4.6, (1989).

*Primary Examiner*—Kevin J. Teska
*Assistant Examiner*—Leigh Marie Garbowski
*Attorney, Agent, or Firm*—Schwegman, Lundberg, Woessner & Kluth, P.A.

[57] ABSTRACT

A method and device for scoping nets from a schematic in a hierarchical netlist. The device is a complementary subsystem to a hierarchical netlister software package. The device allows instances or subcircuits in a schematic to systematically reassign (i.e., scope) local nets which represent global nets to other local nets so that the use of such nets does not affect usage of the global nets elsewhere in the circuit. The device tracks all global nets and maps the corresponding scoped nets to their net identifiers. Then, as the netlister creates the hierarchical netlist, the device replaces the global net's net identifier with the correct net identifier of the corresponding scoped net.

20 Claims, 9 Drawing Sheets

```
311→  line 1   * Library: slib           Cell: inv              View: schematic
312→  line 2   * Last Time Changed Jan 12 07:53:31 1996
313→  line 3   . subckt inv a y bnn gnd bnp vcc
314→  line 4   mna y a gnd bnn N l='lnA' w='wnA'
315→  line 5   mpa y a vcc bnp P l='lpA' w='wpA'
316→  line 6   .ends inv
317→  line 7   *
318→  line 8   * Library: Opus          Cell: c1               View: schematic
319→  line 9   * Last Time Changed Mar 12 10:38:14 1996
320→  line 10  .subckt c1 in out vpp vbb vcc gnd
321→  line 11  xgi0 in net6 vbb gnd vpp vcc inv lnA=1.0 wnA=10.0 lpA=1.0 wpA=20.0
322→  line 12  xgi1 net6 out vbb gnd vpp vcc inv lnA=1.0 wnA=10.0 lpA=1.0 wpA=20.0
323→  line 13  chnl_0 net6 gnd c=2e-12
324→  line 14  c9 vcc net6 c=1e-12
325→  line 15  .ends c1
326→  line 16  *
327→  line 17  * Library: Opus          Cell: Top              View: schematic
328→  line 18  Last Time Changed Mar 12 10:44:18 1996
329→  line 19  v12 MapVccB gnd dc=3.0
330→  line 20  v14 MapVccA gnd dc=5.0
331→  line 21  xi1 in1 out1 vpp vbb vcc gnd c1
332→  line 22  xi2 in2 out2 vpp vbb vcc gnd c1
```

300 Hierarchical Netlist (without Scoped Global Nets)

FIG. 3A

```
line 1    * Library: slib        Cell: inv        View: schematic
line 2    * Last Time Changed Jan 12 07:53:31 1996
line 3    . subckt inv a y bnn gnd bnp vcc
line 4    mna y a gnd bnn N l='lnA' w='wnA'
line 5    mpa y a vcc bnp P l='lpA' w='wpA'
line 6    .ends inv
line 7    *
line 8    * Library: Opus        Cell: c1         View: schematic
line 9    * Last Time Changed Mar 12 10:38:14 1996
line 10   .subckt c1 in out vpp vbb vcc gnd
line 11   xgi0 in net6 vbb gnd vpp vcc inv lnA=1.0 wnA=10.0 lpA=1.0 wpA=20.0
line 12   xgi1 net6 out vbb gnd vpp vcc inv lnA=1.0 wnA=10.0 lpA=1.0 wpA=20.0
line 13   chnl_0 net6 gnd c=2e-12
line 14   c9 vcc net6 c=1e-12
line 15   .ends c1
line 16   *
line 17   * Library: Opus        Cell: Top        View: schematic
line 18   * Last Time Changed Mar 12 10:44:18 1996
line 19   v12 MapVccB gnd dc=3.0
line 20   v14 MapVccA gnd dc=5.0
line 21   xi1 in1 out1 vpp vbb MapVccB gnd c1
line 22   xi2 in2 out2 vpp vbb MapVccA gnd c1
```

F300 Hierarchical Netlist (with Scoped Global Nets)

FIG. 3B

```
procedure( MS_hnlMapNetNames( netNames)
   let ( (mapNodes nodeList key value)
         nodelist = setof(net netNames MS_hnlIsGlobalNet(net))
         foreach(net nodeList
      unless(member(net _MS_HN_TERMS)
         _MS_HN_TERMS = append1(_MS_HN_TERMS net))
   )
   mapNodes = hnlCurrentInst -> mapnodes
   when (mapNodes
      printf( "mapping nets: %s on %s (%s) in %s \n"
         mapNodes
         hnlCurrentInst -> name
         hnlCurrentInst -> cellName
         hnlCurrentCell -> cellName)
      nodeList = parseString(mapNodes "=, ");
      mapNodes = nil
      while( nodeList
         key = concat( car(nodeList))
         nodeList = cdr( nodeList)
         value = car( nodeList)
         nodeList = cdr( nodeList)
         mapNodes = cons( value mapNodes)
         mapNodes = cons( key mapNodes)
      )
      mapNodes = cons( nil mapNodes)
   )
   mapcar( 'hnlMapNetName mapcar( 'MS_hnlMapNodeName netNames))
  )
)
```

FIG. 8

SYSTEM AND METHOD FOR SCOPING GLOBAL NETS IN A HIERARCHICAL NETLIST

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF THE INVENTION

The present invention relates to the design of integrated circuits and in particular to the design, testing, and verification of integrated circuits.

BACKGROUND

Today's integrated circuits (ICs) contain many circuit elements. Computer-aided design (CAD) and computer-aided engineering (CAE) tools are essential in producing these complicated integrated circuits. Circuit design can be represented by a schematic. Schematics consist of symbol instances connected by nets which demonstrate the functional design of the circuit. Symbol instances are pictorial icons that represent a complete functional block. Symbol instances can be primitive elements, such as transistors and resistors. Symbol instances can also be abstractions of combinations of primitive elements, such as NAND gates and NOR gates. Symbol instances can also be higher level groupings of these various elements.

To produce the complicated schematics of an integrated circuit, CAD software can be used. CAD software allows symbols to be saved in software libraries for use by all circuit designers within the entire IC. Portions of the IC can be easily replicated, deleted, and changed with the CAD software.

Another representation of a circuit design is the netlist. A netlist is a text file describing a circuit. The netlist lists all of the symbol instances and their connecting nets within a schematic. CAE software can be used to translate a schematic into a netlist. In an hierarchical netlist, each of the symbol instances are defined a single time, even if the symbol instance is incorporated many times in the circuit.

A netlist is used as input to another CAE tool, the simulator. Simulators use netlists and input stimulus files to imitate the function of the circuit design without having to incorporate the design in hardware. Simulating a circuit by providing netlists and stimulus data is an efficient and cost effective method of testing a circuit.

However, the massive complexity of current circuits introduces problems in circuit design. A typical circuit may now contain several million individual instances. These instances are connected by several million nets. A change in design implementation may necessitate the same change to several thousand corresponding blocks of the circuit. A change in a net within one block may cause unknown effects on other circuit blocks. Integrated circuit manufacturing also introduces problems with circuit design. Because the manufacturing process of ICs involves so many steps on such small objects, there is a relatively high number of imperfect chips made. To salvage such chips, circuits such as DRAM (dynamic random access memory) chips are designed with a higher number of gates than are needed. For example, a 4 Meg DRAM might be designed as a 4.01 Meg DRAM so that up to one-one hundredths of the memory gates may be imperfect on any chip and the chip will still have 4 Meg of functioning memory. After production, the portions of the memory gates which suffer from imperfections must be disabled. This is accomplished by providing several corresponding nets in the circuit. For example, instead of a single power source net (commonly referred to as vcc!), multiple local vcc nets may be implemented. Then, power may be withdrawn from the local vcc nets in the affected chip areas.

These problems in the IC design raise several needs in the art. There is a need for global nets, such as vcc!, to be localized. Then such local nets can be individually managed on the manufactured chips. The implementation of these local nets needs to be convenient and efficient for the circuit designers and the simulation software packages. There is also a need to allow block changes, deletes, and additions to have a minimal amount of affect on the overall design of the circuit. Designers of blocks of ICs should be able to utilize global nets without necessarily worrying about the affect to other blocks of the chip.

SUMMARY OF THE INVENTION

A scoped global net engine is a complementary subsystem to a hierarchical netlister software package. The hierarchical netlister software package takes a schematic of a circuit and translates the instance primitive symbols, instance hierarchical subcircuits and connecting nets into a textual hierarchical netlist for use by a simulator. The scoped global net engine allows instances to reassign global nets to local nets during the hierarchical netlisting processing so that the use of such nets does not affect usage of the global nets elsewhere in the circuit.

The global net engine tracks all global nets and maps the corresponding scoped nets to their net identifiers. Then, as the hierarchical netlister software package creates the hierarchical netlist text, the global net engine replaces the global net's net identifier with the correct scoped net's net identifier.

BRIEF DESCRIPTION OF THE DRAWINGS

FIG. 3A is a hierarchical netlist produced by a hierarchical netlister.

FIG. 3B is a hierarchical netlist produced by the present invention, having scoped global nets.

FIG. 8 is SKILL code for one embodiment of hierarchical netlister engine.

DETAILED DESCRIPTION

In the following Detailed Description, reference is made to the accompanying drawings which form a part hereof and in which is shown by way of illustration specific embodiments in which the invention may be practiced. These embodiments are described in sufficient detail to enable those skilled in the art to practice and to use the invention, and it is to be understood that other embodiments may be utilized and that changes may be made without departing from the spirit and scope of the present invention. The following Detailed Description is, therefore, not to be taken in a limiting sense and the scope of the invention is defined by the appended claims. In the figures, elements having the same number perform essentially the same functions.

Overview

Figure 1:
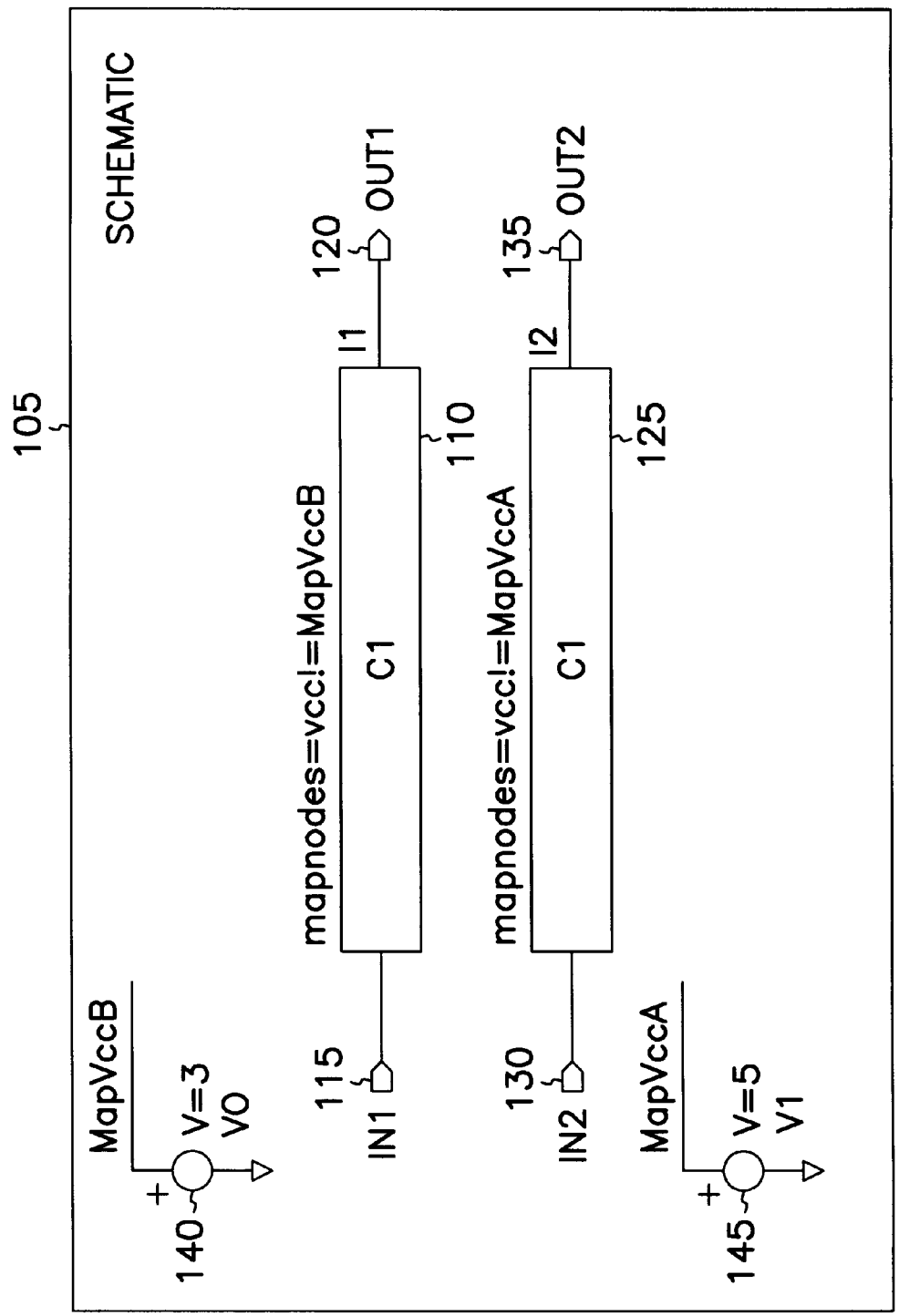
FIG. 1 is a block diagram of a schematic.

The process of circuit design begins, in general, with the creation of the schematic using a CAD/CAE system. Referring now to FIG. 1, such schematic 105 can be created by a computer-aided engineering (CAE) tool. One such CAE tool is Design Entry available from Cadence Design Systems, Inc., San Jose, Calif. The schematic includes the directives needed by the present invention to map global nets to local nets. After the schematic is drawn, the hierarchical netlister is executed to create the netlist. This netlist describes each type of instance occurring in the schematic. The netlist's description includes the global nets scoped to local nets. The netlist is then used by verification and simulation programs (such as HSPICE, available from Meta-Soft, Inc., Campbell, Calif.) to test the schematic before it is implemented in hardware.

Schematics

In FIG. 1, two instances of block C1 110 and 125 are diagramed in schematic 105. Instance C1 110 includes nets IN1 115 and OUT1 120. Similarly, instance C1 125 includes nets IN2 130 and OUT2 135. At this top hierarchical level of schematic 105, the contents of instance C1 110 and instance C1 125 are hidden from view. Instance 140 is a power supply that applies 3 volts to net MapVccB. Similarly, instance 145 applies 5 volts to net MapVccA.

Voltages are often carried throughout a circuit by global nets. A global net is customarily denoted as vcc!, gnd!, etc. The "!" character in the net name indicates that the net is global, i.e. available to the whole schematic. However, circuit designers often need the ability to individually control global nets at various blocks within the circuit. The present invention allows global nets to be scoped to a specific subcircuit. Scoping refers to limiting the affect of a net to a contained hierarchical area.

With the present invention, scoping of global nets is accomplished by the use of a parameter. One such parameter is a "property list." Property lists are data structures supported by Design Entry and other CAD/CAE software systems. A property list for an instance consists of a property name and an associated property value. For example, voltage could be a property which can be indicated on an instance. Power supply instance 140 has such a property list. Instance 140 has voltage shown by a property list. This list has the property name of "v" and the property value of "3." Thus, for instance 140, schematic 105 indicates that three volts are applied by the power supply. Likewise, power supply instance 145 contains a property list showing that five volts are applied.

Subcircuit instances C1 110 and C1 125 each have a property list as well. The property list of these instances has a property name of "mapnodes" and the value of "vcc!= MapVccB" for instance 110 and "vcc!=MapVccA" for instance 125. The present invention achieves scoping of global nets through the creation of these mapnodes property lists.

"Node" is just another name for "net." It follows that the mapnodes property list's purpose is to map, i.e. associate, nets. This property list allows the circuit designer to map a global net to a local net. Therefore, in instance 110, the global net vcc! is mapped to local net MapVccB by the mapnodes property list, and likewise in instance 125, the global net vcc! is mapped to local net MapVccA. Such mappings indicate that whenever the global net vcc! is referenced within instance C1 110 or instance C1 125, the scoped local nets should instead be implemented. In one embodiment of the present invention, the local nets to which global nets are scoped may contain the string "Map" within their local net names or nets can be globals in order for the scoping to be supported. This naming convention serves as a scope identifier, allowing the present invention to only track a subset of the total local nets, i.e. the nets having "Map" as part of their names. In other embodiments, the scope identifier could be changed to another string or eliminated, allowing all nets to be available for scoping.

Figure 2A:
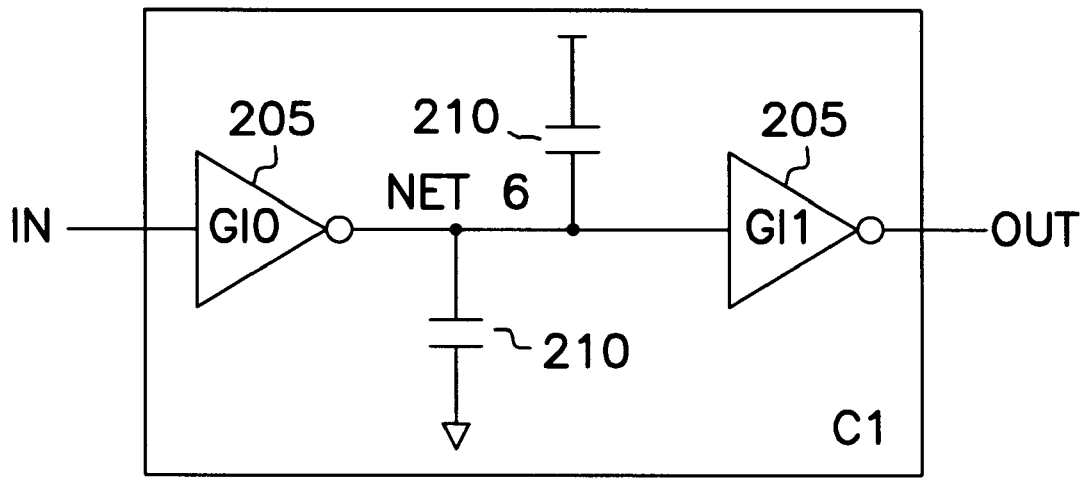
FIG. 2A is a block diagram of subcircuit C1 from FIG. 1's schematic.
Figure 2B:
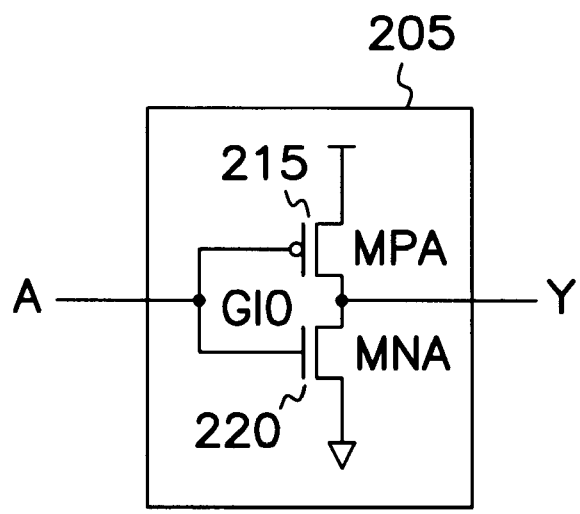
FIG. 2B is a block diagram of an inverter device.

FIG. 2A is the diagram of subcircuit C1 from schematic 105. Instance C1 contains a combination of two inverters GI0 and GI1 205 and two capacitors 210. Referring to FIG. 2B, one can see the components of inverter GI0 or GI1 205. Inverter 205 consists of a p-type transistor 215 coupled with a n-type transistor 220.

HIERARCHICAL NETLISTS

To be useful to a simulator software package, schematic 105, must be translated into a textual netlist file. This translation is done by a translation program, called a netlister. There are two types of netlisters. A flat netlister creates a netlist showing the primitive elements of schematic 105. Such a flat netlister is described in the co-pending patent application titled "SYSTEM AND METHOD FOR SCOPING GLOBAL NETS IN A FLAT NETLIST," by Weber, U.S. patent application Ser. No. 08/692,758, filed on even date herewith, which is hereby incorporated by reference. U.S. patent application Ser. No. 08/692,758 describes an invention which scopes global nets to local nets for output to a flat netlist.

There are several differences between the functioning of a flat netlist and a hierarchical netlister that serve to make implementing the scoping of nets different. For example, a hierarchical netlist only provides a single placement definition for each of the named blocks in a schematic. A netlist of FIG. 3A would be such a traditional hierarchical netlist. However, in a flat netlist, every placement of a block is incorporated into the netlist. A second functional difference between the two types of netlisters is that while a hierarchical netlister only inspects the current hierarchical level for the effects of net scoping, a flat netlister inspects the current hierarchical level and all higher hierarchical levels of the circuit design.

Netlisters are specific to the subsequent software tools which verify or simulate the circuit from the netlists. For example, one useful simulator is HSPICE, available from Meta-Soft, Inc., Campbell, Calif. The corresponding netlister which produces netlists compatible with HSPICE is the HNL Netlister tool, available from Cadence Design Systems, Inc., San Jose, Calif. Therefore, the schematic is converted by the Netlister tool into a hierarchical netlist. HSPICE accepts the netlist as input for simulation. Other simulation and verification tools and other corresponding netlisters implementing the present invention can also be used. The Netlister tool from Cadence allows the easy integration of client-written subroutines to perform specific functionality. In one embodiment, the present invention, the global netlist engine, is implemented as a set of these interfaced subroutines to the Netlister tool.

Again, FIG. 3A is a traditional hierarchical netlist of schematic 105. The hierarchical netlist represents the instances and connecting nets needed to describe schematic 105 for each hierarchical level in the design. Simulators can differentiate between global nets and local nets. A netlist for use by HSPICE would define global nets with the line command ".global". Notice that FIG. 3A does not have any lines beginning with the command ".global". In order to implement hierarchical scoping of nets, this command cannot be used. Instead, all nets are passed through each level of the hierarchy as local nets.

Now referring to FIG. 3A, the netlist itself is formatted in a standardized manner so that it can be interpreted by the HSPICE simulator. In FIG. 3A, asterisks (*) begin all lines that serve as comments. Thus, line 1 311 and line 2 312 are comment lines beginning each with an asterisk.

Line 1 311 starts the definition of the subcircuit instance "inv" and line 2 312 states that this "inv" instance definition was last changed on January 12th. The instance "inv" being defined in this figure corresponds to the inverters within instance C1 110 and C1 125 as shown in FIG. 1 and FIG. 2A. An inverter circuit includes a p-type mosfet, represented by a MPA instance 215 and an n-type mosfet, represented by a MNA instance 220, that have their gates commonly connected to a port "a" and their drains commonly connected to a port "y". The sources of instance MPA 215 and instance MNA 220 are connected to vcc! and gnd!, respectively. Line 3 313 of the hierarchical netlist indicates that "inv" is a subcircuit having the ports y, a, gnd, vec, bnn and bnp. Line 4 314 defines the MNA instance 220. The initial "M" indicates that the instance is a transistor. Line 4 314 shows that the drain is connected to port y; the gate is connected to port a; and the source is connected to port gnd. The model to use in simulating instance MNA 220 is "N", its gate length is dependent upon parameter "lnA" and its gate width is dependent on the parameter "wnA". Similarly, line 5 315 defines MPA instance 215. The definition of the inv subcircuit is closed by line 6 316.

Lines 8 318 through lines 15 325 declare the subcircuit C1. Remember that C1 is found twice in schematic 105, as instance C1 110 and as instance C1 125. Unlike a flat netlister, which would define the circuitry for C1 twice (once for C1 110 and another time for instance C1 125), this hierarchical netlister only defines it a single time. Line 10 320 of the C1 definition declares the ports used by the subcircuit: in, out, vpp, vbb, vcc and gnd. Instance C1 consists of two inverters, xgi0 and xgi1 as well as two capacitors chnl_0 and c9. Line 11 321 defines the first inverter, GI0. The initial "x" signifies that the instance is a subcircuit. The string "inv" indicates a placement of the subcircuit "inv" that was declared in lines 1 311 through 6 316. Port "in" of instance GI0 is equated to instance inv's port a. Similarly, node net6 is equated to the inverter's port y, vbb to bnn, gnd to gnd, vpp to bnp and vcc to vcc. Line 11 321 also sets parameter lnA to 1.0 to be passed along to subcircuit inv's mna instance (refer back to line 4 314). In like fashion, parameters wnA, lpA and wpA are set. Line 12 322 declares the second inverter in instance C1, GI1. Then line 13 323 defines the first capacitor as having two ports connected to net6 and gnd and a capacitance value of 2e–12. Line 14 324 defines the second capacitor and line 15 325 closes the definition of the subcircuit C1.

Lines 17 through 22, 327 through 332, define the highest hierarchical level of schematic 105, called Top. Two power supplies are defined in lines 19 329 and 20 330, which both begin with the identifier "v". Voltage is indicated as 3.0 volts for the first power supply and 5.0 for the second one. In line 19 329, power supply is connected to net MapVccB. Similarly, in line 20 330, power supply is attached to net MapVccA. Line 21 331 and line 22 332 show that both instances of C1 are connected to global net vcc.

Referring to FIG. 3B, which is a hierarchical netlist having scoped global nets, the results of the present invention are seen. Here, the local nets MapVccA and MapVccB have been used to scope the global net vcc! within the instances of C1 110 and 125. The definitions of subcircuit inv and c1 are identical to those from FIG. 3A. Only the Top Cell definition, found on line 17 327 through line 22 332 is different. In FIG. 3B, instead of instance c1 110 being connected to port vcc, it is now connected to the local port MapVccB at line 21 331. Instead of instance c1 125 being connected to port vcc, it is now connected to the local port MapVccA at line 22 332.

Creating Hierarchical Netlists

Figure 4:
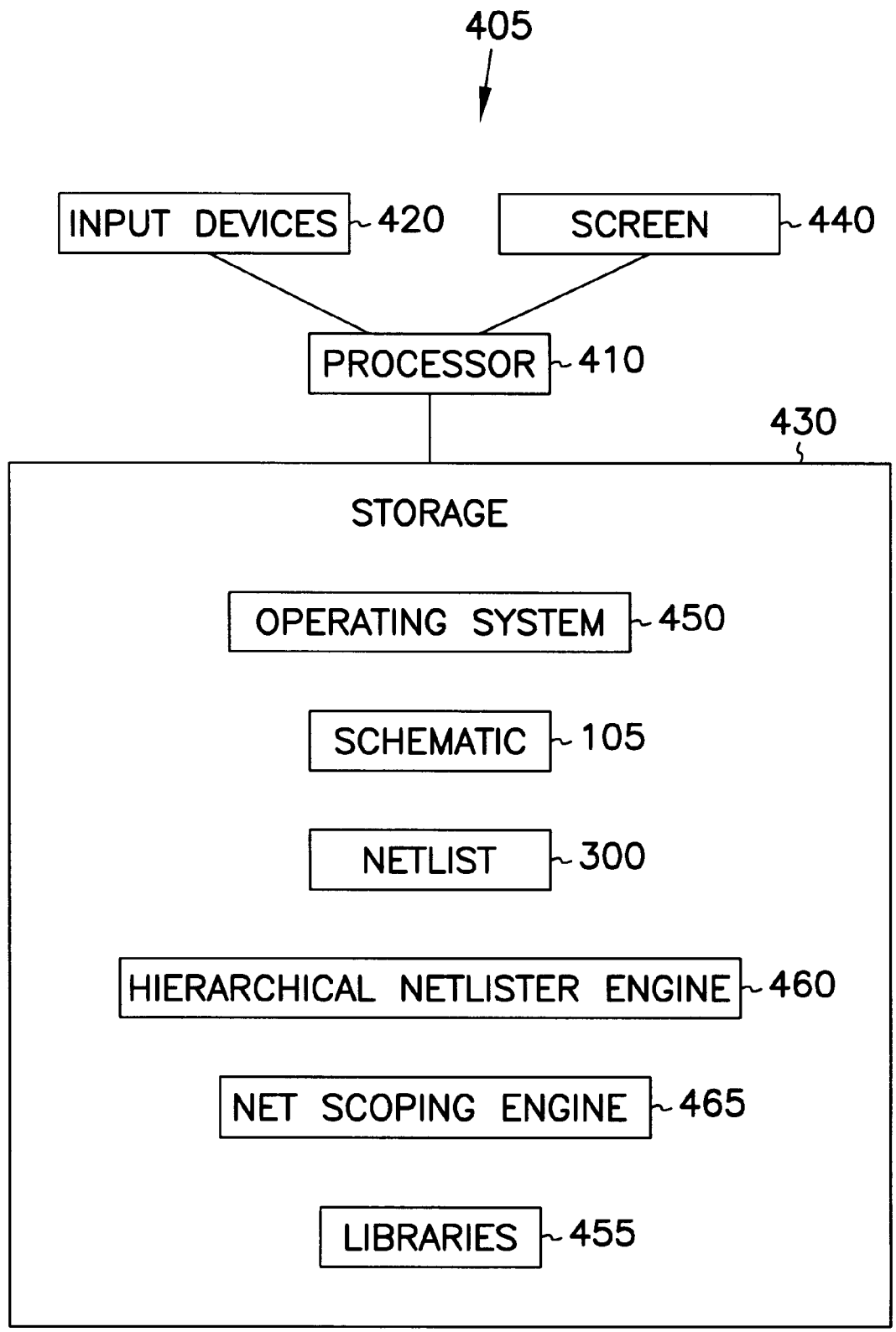
FIG. 4 is a block diagram of a computer system.

FIG. 4 is a block diagram of a computer system 405 in which the present invention is capable of being implemented. A processor 410 is connected to input devices 420, such as a keyboard, mouse or digital drawing pad. Processor 410 is also connected to storage devices 430 (including RAM and disk drives) and a screen display 440. Within RAM storage device 430, is operating system 450, schematic 105, instance libraries 455, and hierarchical netlist 300. Storage devices 430 also include hierarchical netlister engine 460 and an embodiment of the present invention, net scoping engine 465. Hierarchical netlister engine 460 and net scoping engine 465 are software programs residing in computer system 405. Hierarchical netlister engine 460 can be Cadence's Netlister tool or other available software engine. In one embodiment, net scoping engine 465, is interfaced with hierarchical netlister engine 460 so that hierarchical netlister engine 460 passes the constructed hierarchical netlist file 300 to net scoping engine 465 for processing before being written out to paper or disk.

Figure 5:
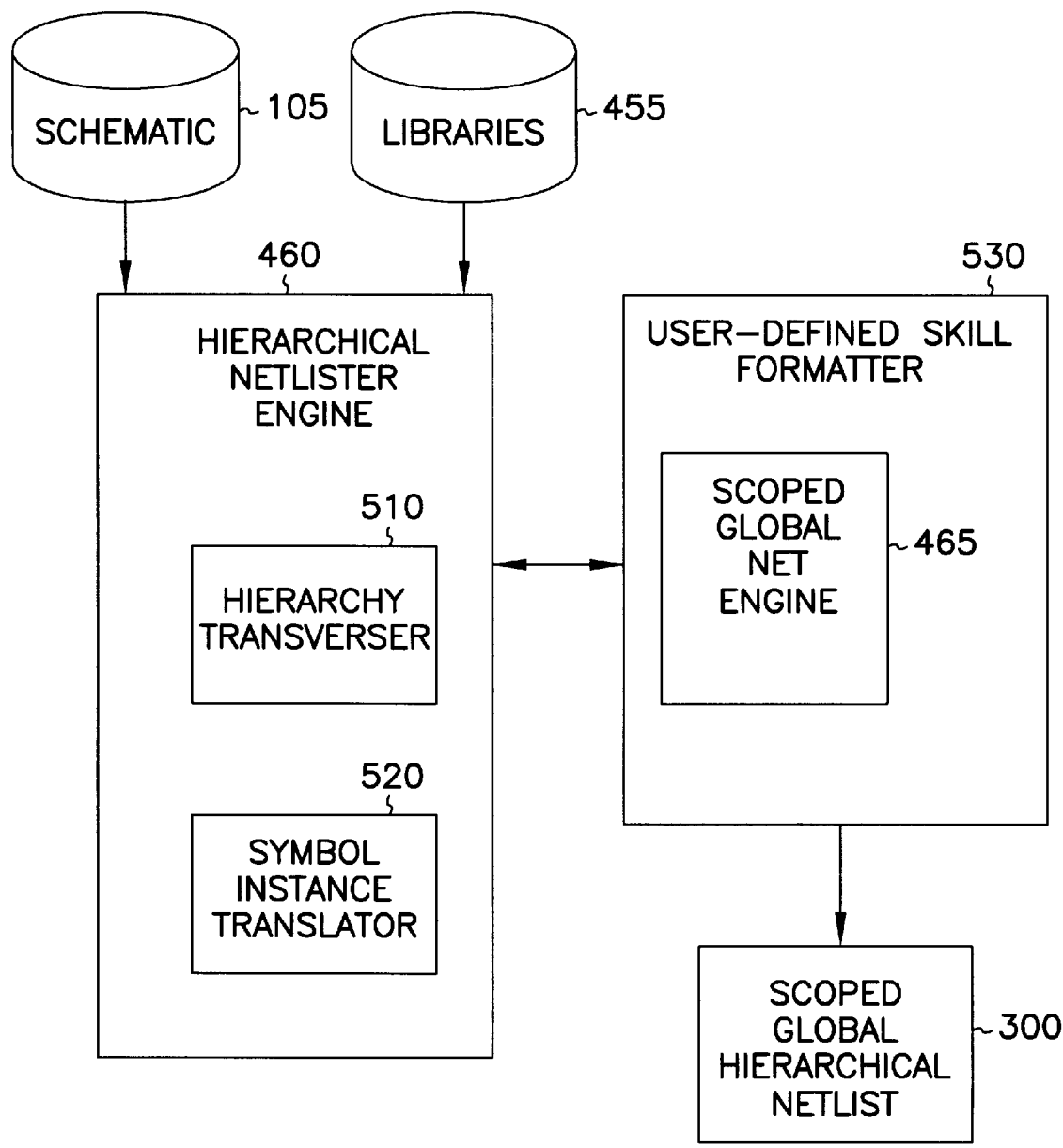
FIG. 5 is block diagram of the interface between hierarchical netlister engine and the formatter.

FIG. 5 shows hierarchical netlister engine 460 and net scoping engine 465 in more detail. Schematics 105 and libraries 455 are fed as inputs to hierarchical netlister engine 460. Hierarchical netlister engine 460 contains hierarchy traverse 510, which walks through the designed schematic's hierarchy of symbol instances and nets, and the symbol instance translator 520, which converts the pictorial symbol instances from schematic 105 into the appropriate text string of netlist 300. Integrated to hierarchical netlister engine 460 is formatter 530. Formatter is a collection of user supplied functions. A subset of these functions make up net scoping engine 465. The resulting product from hierarchical netlister engine 460 and formatter 530 is a hierarchical netlist 300. In one embodiment, hierarchical netlister engine 460 and net scoping engine 465 can be written in SKILL, a language provided by Cadence Design Systems, Inc., San Jose, Calif. In such an embodiment, net scoping engine 465 can be implemented as user-provided SKILL functions MS_hnlMapNodeName( ) and MS_hnlMapNetNames( ). One implementation of MS_hnlMapNetNames( ) is provided in FIG. 8. In other embodiments, computer languages such as C++, Pascal, and SmallTalk could be used.

Figure 6:
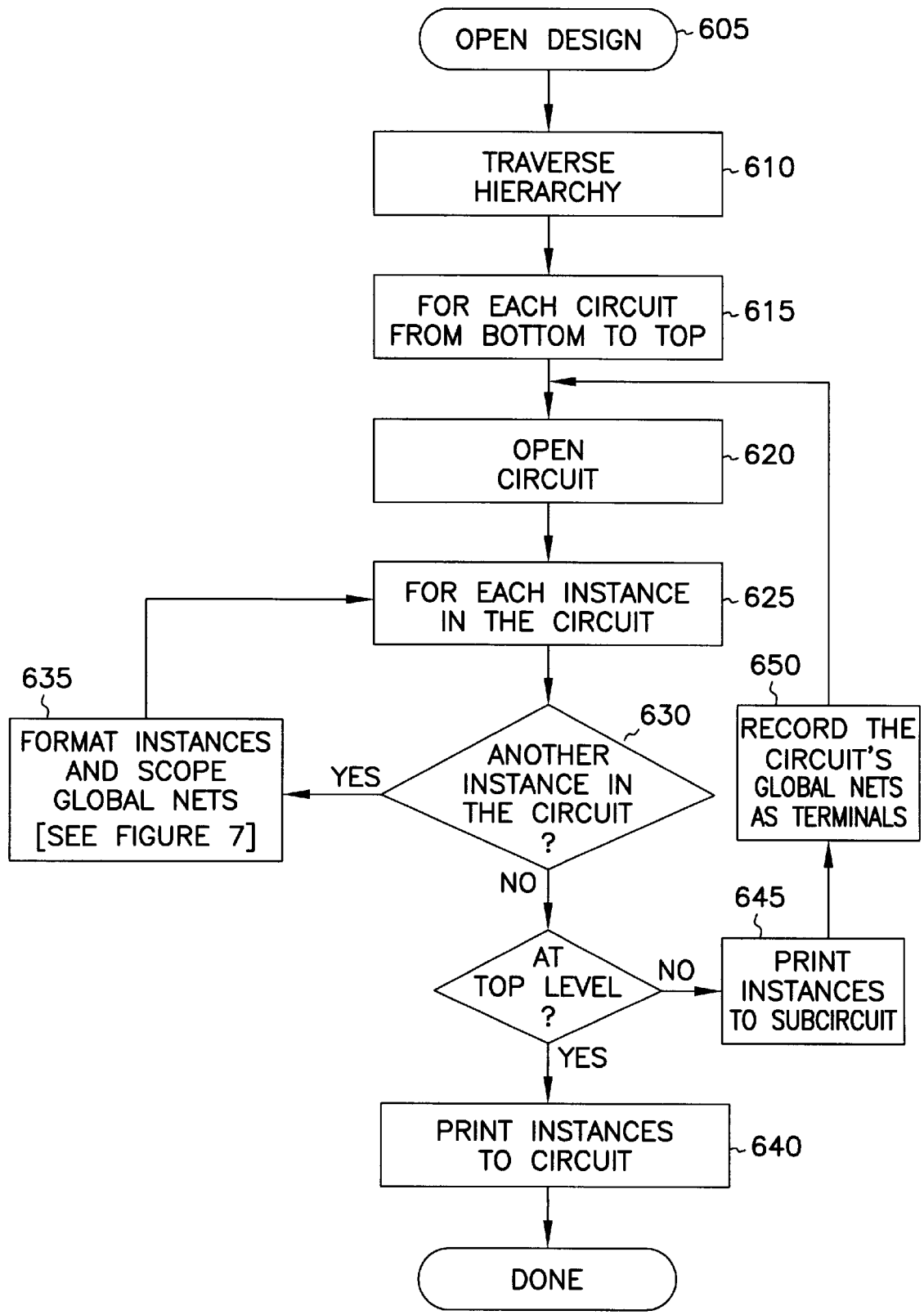
FIG. 6 is a flowchart of the activities performed by hierarchical netlister engine and the formatter.

FIG. 6 is a flowchart illustrating hierarchical netlister engine 460 and its interface with formatter 530. At step 605, schematic 105 of the design is opened. At step 610, hierarchical netlister engine 460 traverses the hierarchy of the design. At steps 615 and 620, each circuit of schematic 105 is delivered from the bottom level to the topmost level of the hierarchy and is opened. Steps 625 and 630 loop through each instance in the circuit and control is passed to formatter 530 at step 635 so that the instance can be formatted. The detailed workings of formatter 530 with respect to the scoping of global nets will be described with reference to FIG. 7. After step 630, if the level being processed is the topmost level, the instances are printed to the circuit at step 640. Otherwise, if the topmost level of the design is not being processed, the instances are printed to the subcircuit at step 645. Then at step 650 a list of nets attached to the terminals of the current circuit together with any global nets used by instances below the current circuit is tracked. This "all-global" list will be used to transport the local nets representing global nets throughout the circuit. This all-global list is saved and is then passed, in step 635, to formatter 530 in order to bring the nets up when the circuit is instantiated in other hierarchical levels. After step 650, control returns to step 620.

Figure 7:
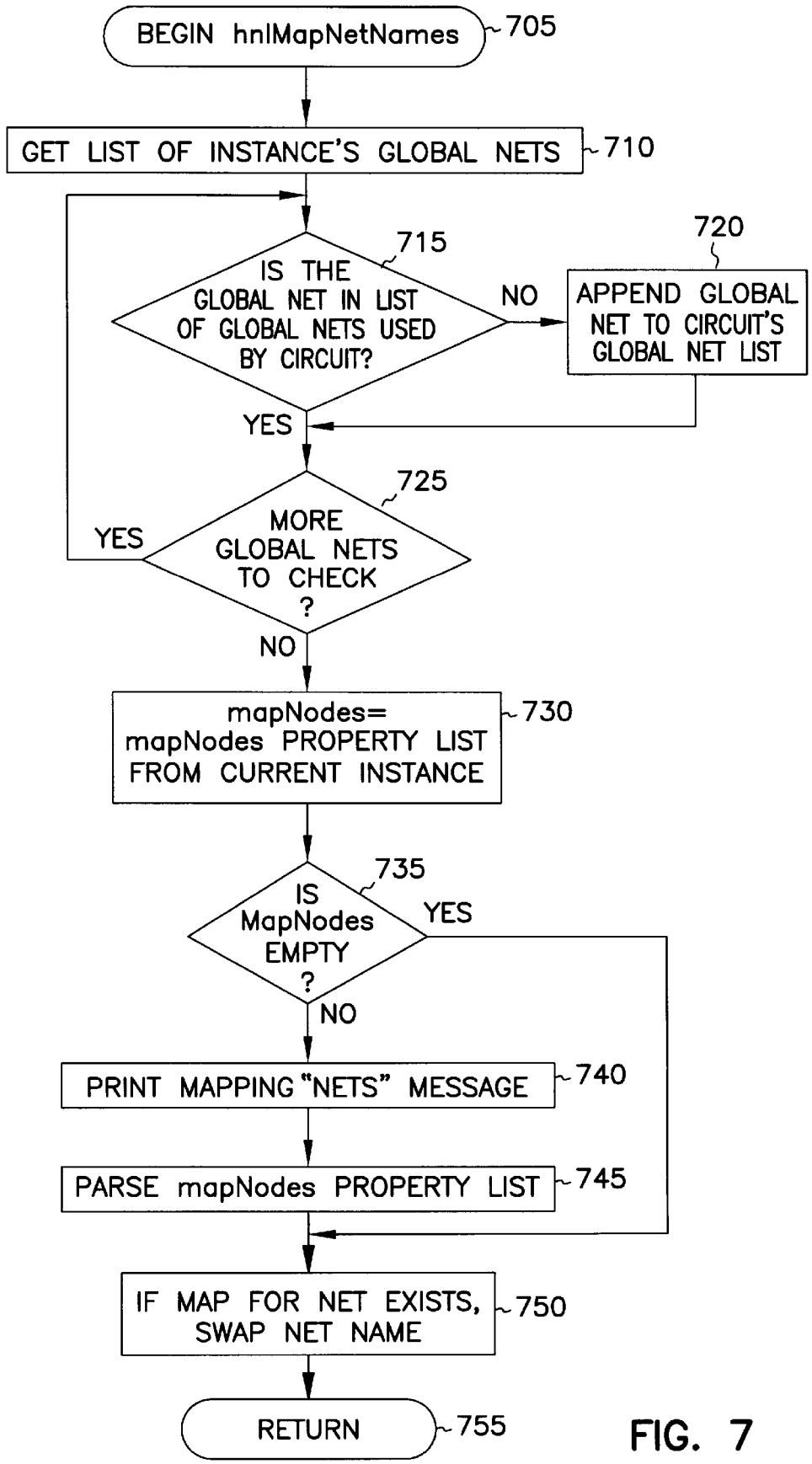
FIG. 7 is a flowchart showing how the formatter maps global nets.

Now referring to FIG. 7, formatter 530's scoping of global nets, which in one embodiment is performed by SKILL subroutine hnlMapNetNames, is flowcharted. At step 710, the nets in the instance that are global nets are retrieved. Then at steps 715 through 725, these global nets are added to the circuit's global node list or other type of mapping association. This node list is made by accumulating all of the global nets used by any of the instances the circuit is made of. Primitive instances (which are the lowest hierarchical level) begin with a list of terminals which, when checked, may be connected to global nets. If they are connected to global nets, these nets are accumulated and are stored as a list of global nets for each subcircuit these primitives are instantiated in. A previously defined subcircuit may be instantiated as an instance in an upper level subcircuit, in which case its list of net names includes global nets used. These nets are accumulated together with nets from primitives and are stored as a list of global nets for the current subcircuit being netlisted.

Then at step 730, the mapnodes property list parameter is retrieved from the instance. If this parameter is not empty at step 735, i.e., there are scoped global nets in the instance, then at step 740 a message is displayed to the system user notifying the user that the nets are being mapped. At step 745, the mapNodes property list is parsed. The global nets to be scoped are extracted and placed in an ordered list alongside their associated local nets. Finally, at step 750, a function inspects each of the instance's nets. For each net which exists in the ordered list, the local net replaces the scoped global net.

Other embodiments of the present invention are possible without departing from the scope and spirit of the present invention. Other embodiments of this invention include a configuration allowing global nets to be scoped using the global command. A configuration might also be implemented to allow scoped local nets to not be required to contain the letters "Map."

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

We claim:

1. A method for scoping nets, comprising:
creating a schematic file for representing a circuit design, wherein the schematic file comprises a plurality of instances and a plurality of nets, wherein the plurality of instances comprises a plurality of primitives and a plurality of subcircuits, and wherein the plurality of nets comprises a plurality of first nets and a plurality of second nets;
entering a scoped net instruction for assigning one of the plurality of second nets to a one of the plurality of first nets within one of the plurality of instances of the schematic file, wherein the scoped net instruction comprises a first net name and a second net name, and wherein the scoped instruction is to be enforced only within that instance;
storing the schematic file on a computer memory; and
converting the schematic file to a hierarchical netlist for inputting to a simulator or verifier, wherein the step of converting comprises the steps of:
constructing a text description for describing a placement for each of the plurality of instances, and the connectivity of each of the plurality of instances to the plurality of nets;
locating a plurality of scoped net instructions in the plurality of instances;
extracting a first scoped net name and a second scoped net name from the scoped net instruction for each of the plurality of scoped net instructions;
determining a first net identifier for the first scoped net name for each of the plurality of scoped net instructions;
determining a second net identifier for the second scoped net name for each of the plurality of scoped net instructions; and
substituting the second net identifier for the first net identifier in the text description for each of the plurality of scoped net instructions.

2. The method for scoping nets as recited in claim 1, wherein the step of locating a plurality of scoped net instructions in the plurality of the instances comprises the step of locating a predefined scoped net instruction string within a parameter of the plurality of the instances.

3. The method for scoping nets as recited in claim 1, wherein the step of converting the schematic file to a hierarchical netlist further comprises the step of creating a mapping association for associating a first plurality of net identifiers with a second plurality of net identifiers.

4. The method for scoping nets as recited in claim 1, wherein the plurality of nets are local nets and wherein a plurality of the plurality of nets represent global nets in a hierarchical netlist.

5. The method for scoping nets as recited in claim 4, wherein the step of converting the schematic file to a hierarchical netlist further comprises the steps of:
gathering the plurality of nets representing global nets from each of the plurality of subcircuits of the schematic file; and
tracking the plurality of nets representing global nets through an all-global list for making the plurality of nets representing global nets available throughout the plurality of instances.

6. The method for scoping nets as recited in claim 4, wherein the step of converting the schematic file to a hierarchical netlist further comprises the step of declaring the plurality of nets representing global nets in the subcircuit definition section of the text description.

7. A method for scoping nets, comprising the steps of:
tracking a plurality of nets from a hierarchical netlister program on a computer system,
wherein said plurality of nets comprise a first plurality of nets and a second plurality of nets,
wherein the first plurality of nets comprise a first plurality of net names and a first plurality of net identifiers, wherein the second plurality of nets comprise a second plurality of net names and a second plurality of net identifiers, and wherein the step of tracking comprises the steps of:
retrieving a second net from the second plurality of nets for scoping a first net from the first plurality of nets; and
assigning a second net identifier from the second plurality of nets;

creating a mapping association for associating a third net from the first plurality of nets with a fourth net from the second plurality of nets, wherein the step of creating a mapping association comprises the steps of:
receiving a parameter for an instance in a schematic;
checking the parameter for a scoped net instruction;
extracting a third net name from the scoped net instruction;
extracting a fourth net name from the scoped net instruction;
determining a third net identifier for the third net name;
determining a fourth net identifier for the fourth net name;
associating the third net identifier to the fourth net identifier; and
storing the associated third net identifier and fourth net identifier to a mapping association;

transforming a net for hierarchical scoping, wherein the step of transforming comprises:
retrieving a fifth net identifier;
locating the fifth net identifier in the mapping association;
locating a sixth net identifier associated with the fifth net identifier in the mapping association; and
replacing the fifth net identifier with the sixth net identifier in a text description.

8. The method for scoping nets, as recited in claim 7, wherein the step of tracking farther comprises the step of checking the first plurality of nets for the occurrence of a predefined scope identifier string.

9. The method for scoping nets, as recited in claim 7, wherein the step of tracking further comprises the step of creating a comment line for the first plurality of nets.

10. The method for scoping nets, as recited in claim 7, wherein said plurality of nets are local nets and wherein a plurality of the plurality of nets represent global nets in a hierarchical netlist.

11. The method for scoping nets as recited in claim 10, the method further comprising the steps of:
gathering the plurality of nets representing global nets from each of the plurality of subcircuits of the schematic file; and
tracking the plurality of nets representing global nets through an all-global list for making the plurality of nets representing global nets available throughout the plurality of instances.

12. The method for scoping nets as recited in claim 10, wherein the step of converting the schematic file to a hierarchical netlist further comprises the step of declaring the plurality of nets representing global nets in the subcircuit definition section of the text description.

13. A hierarchical net scoping device, comprising:
a net tracker for performing the steps of:
providing a first plurality of local nets for representing global nets in a plurality of instances of a schematic file, wherein the first plurality of local nets comprises a first plurality of local net names and a first plurality of local net identifiers, and wherein the plurality of instances comprises a plurality of primitives and a plurality of subcircuits;
providing a second plurality of local nets, wherein the second plurality of local nets comprises a second plurality of local net names and a second plurality of local net identifiers;
retrieving a first local net from the first plurality of local nets; and
assigning a first local net identifier for the first local net;
a map list creator for associating a first local net from the first plurality of local nets with a second local net from the second plurality of local nets, the map list creator comprising:
an instruction checker for inspecting a parameter of an instance of a schematic for a scoped net instruction;
an extractor for extracting a first local net name and a second local net name from the scoped net instruction;
a name resolver for determining a first local net identifier for the first local net name and a second local net identifier for the second local net name;
a name associator for storing an association of the first local net identifier to the second local net identifier in a mapping association;
a net scoper for transforming a net to be locally scoped within a hierarchical netlist, wherein the net scoper comprises:
a net receiver for accepting a third local net identifier;
a map locator for locating the third local net identifier in the mapping association;
an association locator for locating a fourth local net identifier associated to the third local net identifier in the mapping association; and
a net replacer for replacing the third local net identifier with the fourth local net identifier.

14. The hierarchical net scoping device, as recited in claim 13, wherein the instruction checker performs the step of checking the parameter of the instance for the occurrence of a predefined scope identifier string.

15. The hierarchical net scoping device, as recited in claim 13, wherein the net tracker further performs the step of creating a comment line for the first local net.

16. The hierarchical net scoping device, as recited in claim 13, further comprising:
a net gatherer for gathering the first plurality of local nets representing global nets from each of the plurality of subcircuits of a schematic file; and
a global tracker for tracking the first plurality of local nets representing global nets through an all-global list for making the plurality of nets representing global nets available throughout the plurality of instances.

17. The hierarchical net scoping device, as recited in claim 13, further comprising a net declarer for declaring the first plurality of local nets representing global nets in the subcircuit definition section of the hierarchical netlist.

18. A computer program product, comprising:
a computer usable medium having a computer readable program code means embodied therein for causing nets in a schematic to be scoped to a local region on a hierarchical netlist, the computer readable program code means in said computer program product comprising:
computer readable program code means for causing a computer to track a plurality of local nets, wherein the plurality of local nets comprises a first plurality of local nets for representing global nets and a second plurality of local nets, wherein the first plurality of local nets comprise a first plurality of local net names and a first plurality of local net identifiers, wherein the second plurality of local nets comprise a second plurality of local net names and a second plurality of local net identifiers;

computer readable program code means for causing a computer to retrieve a first local net from the plurality of nets;

computer readable program code means for causing a computer to assign a first local net identifier to the first local net;

computer readable program code means for causing a computer to create a mapping association for associating a third plurality of local nets from the first plurality of local nets with a fourth plurality of local nets from the second plurality of local nets;

computer readable program code means for causing a computer to receive a parameter for an instance in the schematic;

computer readable program code means for causing a computer to check the parameter for a scoped net instruction;

computer readable program code means for causing a computer to extract a first local net name from the scoped net instruction, wherein the first local net name is from the third plurality of local nets;

computer readable program code means for causing a computer to extract a second local net name from the scoped net instruction, wherein the second local net name is from the fourth plurality of local nets;

computer readable program code means for causing a computer to determine a first local net identifier for the first local net name;

computer readable program code means for causing a computer to determine a second local net identifier for the second local net name;

computer readable program code means for causing a computer to associate the first local net identifier to the second local net identifier;

computer readable program code means for causing a computer to store the associated first local net identifier and the second local net identifier to a mapping association;

computer readable program code means for causing a computer to transform a net to be locally scoped within a hierarchical netlist;

computer readable program code means for causing a computer to retrieve a third local net identifier;

computer readable program code means for causing a computer to locate the third local net identifier in the mapping association;

computer readable program code means for causing a computer to locate a fourth local net identifier associated with the third local net identifier from the mapping association; and computer readable program code means for causing a computer to replace the third local net identifier with the fourth local net identifier.

19. The computer program product, as recited in claim 10, further comprising computer readable program code means for causing a computer to check the first local net for the occurrence of a predefined scope identifier string.

20. The computer program product, as recited in claim 10, further comprising computer readable program code means for causing a computer to create a comment line for the first local net.

* * * * *

UNITED STATES PATENT AND TRADEMARK OFFICE
CERTIFICATE OF CORRECTION

PATENT NO. : 5,901,064

DATED : May 4, 1999

INVENTOR(S) : Larren Gene Weber, Calwell; Ronald L. Taylor, Meridian, both of Id.

It is certified that error appears in the above-identified patent and that said Letters Patent is hereby corrected as shown below:

At Col. 8, line 58, please delete "global nets in the subcircuit" and insert --global nets in a subcircuit--

At Col. 9, line 58-59, please delete "converting the schematic file to a hierarchical netlist further comprises" and insert --transforming further comprises--

At Col. 9, line 60, please delete "global nets in the subcircuit" and insert --global nets in a subcircuit--

At Col. 12, line 29, please delete "as recited in claim 10," and insert --as recited in claim 18,--

At Col. 12, line 33, please delete "as recited in claim 10," and insert --as recited in claim 18,--

Signed and Sealed this

Twenty-fifth Day of January, 2000

Attest:

*Attesting Officer*      *Acting Commissioner of Patents and Trademarks*